United States Patent [19]

Ziemek

[11] Patent Number: 5,099,723
[45] Date of Patent: Mar. 31, 1992

[54] STRIPPER DIE AND METHOD OF INCREASING THE SERVICE LIFE THEREOF

[75] Inventor: Gerhard Ziemek, Langenhagen, Fed. Rep. of Germany

[73] Assignee: Kabelmetal Electro GmbH, Hanover, Fed. Rep. of Germany

[21] Appl. No.: 659,635

[22] Filed: Feb. 25, 1991

[30] Foreign Application Priority Data

Aug. 23, 1990 [DE] Fed. Rep. of Germany ....... 4026607

[51] Int. Cl.$^5$ .......................... B21K 5/20; B21C 25/10
[52] U.S. Cl. ..................................... 76/107.1; 72/254; 29/557

[58] Field of Search ................ 76/107.1, 101.1, 107.4; 29/557, 33.5, 33.52, 33 F; 72/254, 255; 83/914, 924

[56] References Cited

U.S. PATENT DOCUMENTS 3,911,541 10/1975 Ziemek et al. ......................... 29/557

Primary Examiner—Roscoe V. Parker
Attorney, Agent, or Firm—James C. Jangarathis

[57] ABSTRACT

A stripping die having a cutting edge formed by the intersection of a truncated pyramid outer surface and an axial bore inner surface; such surfaces first being cut until the surface roughness thereof is less than 1 um., and then being coated with a high hardness, high wear resistant metallic compound having a uniformly thin thickness of between 1 and 10 um.

7 Claims, 1 Drawing Sheet

STRIPPER DIE AND METHOD OF INCREASING THE SERVICE LIFE THEREOF

The present invention relates to a die for stripping a surface layer from an elongated aluminum member such as a wire or rod, and a method of increasing the service life thereof.

Priorly known tools for stripping surface layers from aluminum or aluminum alloy wires have usually been constructed of tool steel, and have been configured as circular dies with cutting edges formed by the intersections of truncated pyramid outer surfaces and axial bore inner surfaces. (One employment of stripping dies of the type here considered is disclosed in U.S. Pat. No. 3,911,541, issued Oct. 14, 1975.) The truncated pyramids of such prior art stripping dies have included either four or six truncated pyramid faces, with adjacent ones of such faces forming breaking edges that break the stripped material of minute thickness from the elongated metallic member when it passed through the stripping die.

The manufacture of the aforesaid prior art stripping dies included the grinding of the truncated pyramid faces for sharpening the cutting edges, and the subsequent hardening of the cutting surfaces by the formation of chrome layers on such faces by galvanic procedures. During the galvanic deposition of the chrome layers the deposition in the areas of closest proximity to the cutting edges was greater than in the areas further removed because of variances in current densities. The deposition of chrome in the areas in closest proximity to the breaking edges was also greater than in the areas further removed. These areas of greater chrome deposition resulted in hardened but dull cutting edges, and hardened but dull breaking edges; and resulted in areas of high roughness, and a coefficient of friction that required a high axial force to pass the elongated member to be stripped through the stripping die.

OBJECTS OF THE INVENTION

An object of the present invention is to increase by a multitude the service life of a stripping die by rendering the surfaces thereof that come into contact with an elongated metallic member to be stripped both of low roughness (peak to valley) and of high wear resistance.

Another object of the present invention is to provide a stripping die having an increased service life, without a decrease in the sharpness of the cutting edges or the breaking edges thereof.

A further object of the present invention is to provide a stripping die that requires a minimal axial force to pass therethrough an elongated member to be stripped.

SUMMARY OF THE INVENTION

These and other objects of the present invention are achieved by a method of increasing the service life of a stripping die by first cutting the surfaces that form the cutting edge of the die until the surface roughness of such surfaces, peak to valley, is limited to less than 1 um.; and then coating such surfaces with a thin, high hardness, high wear resistant metallic compound having a uniform thickness between 1 and 10 um. for providing a low surface roughness of the coating itself. Such wear resistant metallic compound may comprise a metal nitride such as titan nitride, a metal carbide such as titan carbide, or a metal carbon nitride such as titan carbon nitride, with a uniform coating thickness preferably between 1 and 4 um. The combination of the high hardness and long wear resistancy of such coatings with the thin, uniform configuration thereof, results in a stripping die whose coated cutting surfaces are smooth yet highly wear resistant and not dulled at the cutting or breaking edges by such coatings. Since the coated surfaces have low roughness characteristics, the amount of friction experienced by the elongated metallic member as it passes through the stripping die is minimal.

As for the aforesaid coatings, it has been found advantageous to use PVD (Physical-Vapor-Deposition) methods wherein high vacuum deposition is employed. Of particular advantage is ion electroplating with arc discharge. This procedure ha high ionization of the generated stream and high particle energy, whereby the deposition of a dense, adhering coating is assured at low temperatures. Such coatings of titan nitride, titan carbide, and titan carbon nitride have been found to be preferable in the exercise of the present invention.

BRIEF DESCRIPTION OF THE DRAWINGS

A better understanding of the present invention, as well as the objects and advantages thereof will become apparent upon consideration of the following detailed disclosure thereof, especially when taken with the accompanying drawings; wherein:

With reference to FIG. 1, there is depicted a vapor deposition enclosure 25 having a vacuum connection 1 for evacuating the inner space within the enclosure. Centrally positioned within the enclosure 25 is a support platform 3 connected to an electrical power source 2. Positioned in the top and side walls of the enclosure 25 are three vaporizers 6 which are positioned so as to distribute metallic vapors in the direction of the arrows 7 toward a plurality of shaving dies 8 placed upon the support platform 3. Each of the vaporizers 6 have a cathode potential and each of the shaving dies 8 have an anode potential. Further positioned in the side walls of the enclosure 25 is a gas inlet 4 and a gas outlet 5. Through the gas inlet 4 a neutral gas such as argon is fed into the enclosure 25. Alternatively, if a chemical compound such as titan carbide methane or titan nitride nitrogen is to be employed, methane is fed through the gas inlet 4. During the vapor deposition procedure, the pressure within the enclosure 25 is maintained in the range of $10^{-3}$ mbar. The vaporizers 6 employ electrical arcs (not shown) upon their vaporization targets; and the metallic vapors have a high degree of ionization, about 90 percent. The support platform 3 is rotated during the vapor deposition process to assure that the shaving dies 8 positioned thereon are uniformly coated. This described manner of coating is referred to as arc-vaporization and is a variance from ion electroplating.

With reference to FIGS. 2 and 3, the shaving die 8 is comprised of tool steel and includes a mounting flange 9 through which three screw bores 10 extend. The shaving die 8 includes a cutting edge 12 formed by the intersection of a truncated pyramid outer surface 16 and an axial bore inner surface 11. The cutting edge 12 has a side profile comprised of a series of connected arcs formed by the intersection of each of the six outer faces 13 of the outer surface 16 and the cylindrical cross-section of the inner surface 11. The adjacent outer faces 13 form therebetween a breaking edge 14 that breaks the shavings of minute thickness from the circumferential surface of an elongated metallic member when it is passed through the shaving die 8.

Figure 1:
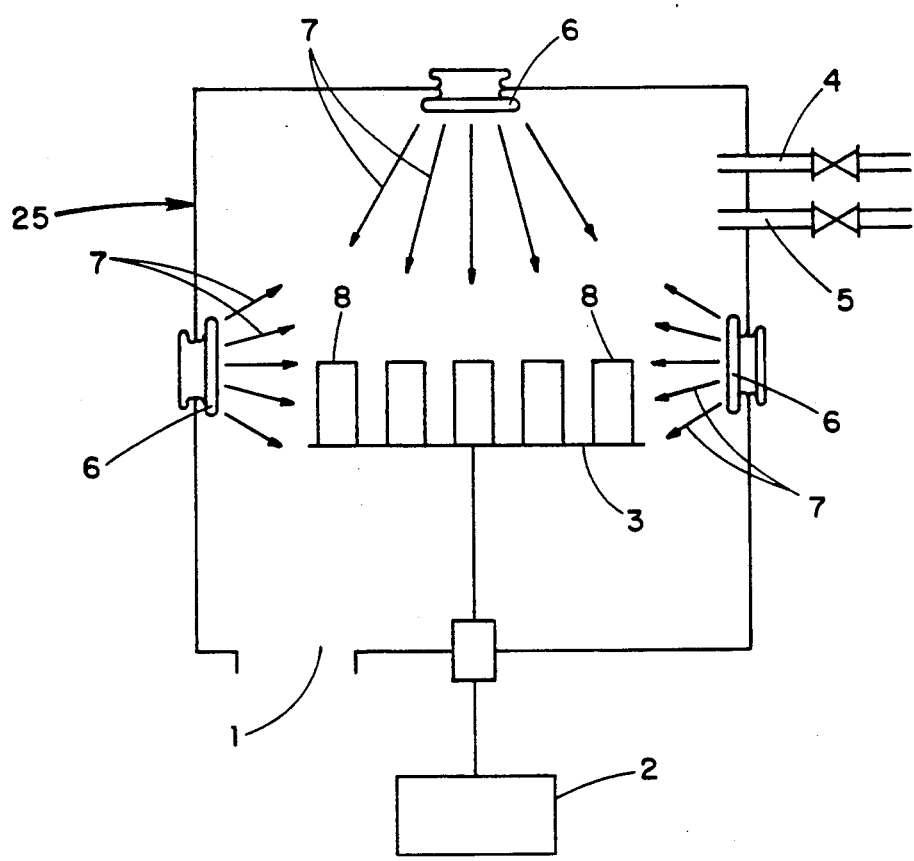
FIG. 1 is a diagrammatic representation of a vapor deposition enclosure utilized in accordance with the present invention to coat the surfaces of a stripping die with a high hardness, wear resistant metallic compound.
Figures 2, 3:
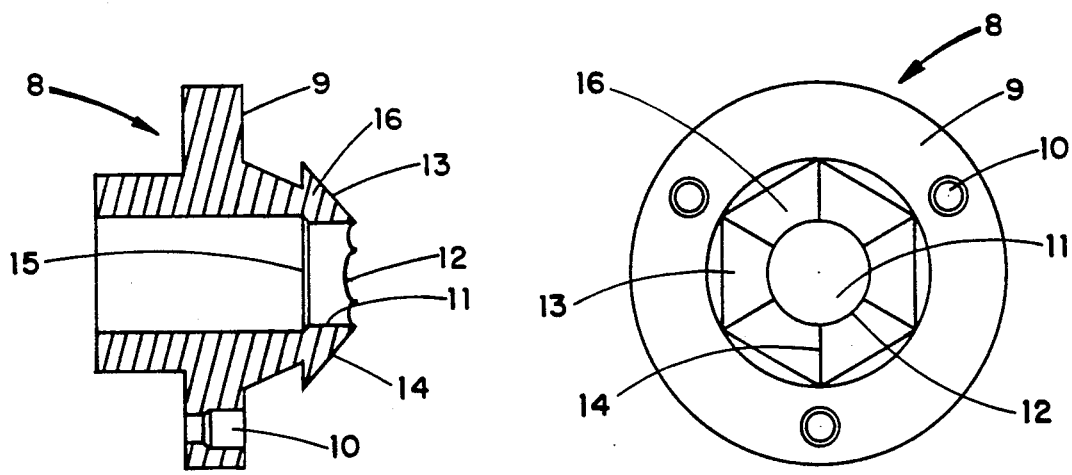
FIGS. 2 and 3 are diagrammatic representations of side and front elevation views of a stripping die employed in the exercise of the present invention.

The cutting device 8 is initially configured by lathing, grinding and drilling techniques, and then case hardened. Thereafter, the cutting edge 12 is cut by the lapping or honing of the six outer faces 13 and the inner face 11 up to an offset bore 15 until the surface roughness thereof, peak to valley, is less than 1 um., preferably less than 0.25 um. After such lapping or honing, the shaving die 8 is cleansed and is then covered with a uniformly thin layer of titan nitride, or titan carbonate nitride, preferably between 1 and 4 um., on each of the outer surfaces 16 as well as the inner surface 11 up to the offset bore 15. Such coating is provided by the PVD procedures noted above with respect to FIG. 1. Of particular advantage in this regard is ion electroplating with arc discharge (PVD-Arc Method). This method has the advantage of a high ionization of the generated vapors with high particle energy. Further, the temperature which the shaving dies 8 assume due to such coating process does not exceed the tempering temperature of the metallic material of the shaving dies 8. Usually, 200° C. is not exceeded.

Shaving dies 8 with titan nitride coatings made in accordance with the present invention have been used in an apparatus for stripping the outer surfaces of aluminum core wires in the manufacture of copper sheathed, aluminum wires. The service life of such shaving dies was found to be twelve times greater than that of shaving dies of hardened, uncoated, tool steel; and six times greater than shaving dies having a hard chromed coating. Further, it was observed that the drawing force required for pulling the core aluminum wire through the shaving die 8 was far less than that required for the aforesaid prior art, shaving dies. Additionally, the outer surfaces of the core aluminum wires were substantially smoother when the shaving die of the instant invention were employed, as distinguished from when the priorly known shaving dies were employed.

While the invention has been described in connection with an exemplary embodiment thereof, it will be understood that many modifications will be apparent to those of ordinary skill in the art and that this application is intended to cover any adaptations or variations thereof. Therefore, it is manifestly intended that the invention be only limited by the claims and equivalents thereof.

What is claimed:

1. Method for increasing the service life of a die for stripping the outer surface of an elongated metallic member, said die including a cutting edge formed by the intersection of a truncated pyramid outer surface and an axial bore inner surface, comprising the steps of:
    cutting said surfaces forming said cutting edge until the surface roughness thereof, peak to valley, is less than 1 um.; and
    coating said surfaces forming said cutting edge with a high hardness, high wear resistant metallic compound having a uniformly thin thickness of between 1 and 10 um.

2. Method in accordance with claim 1, wherein said cutting of said surfaces forming said cutting edge is performed by lapping or honing said surfaces.

3. Method in accordance with claim 1, wherein said coating of said surfaces forming s id cutting edge is performed by vaporization in a high vacuum environment by ion electroplating.

4. Method in accordance with claim 1, wherein said coating of said surfaces forming said cutting edge is performed by vaporization in a high vacuum environment by ion electroplating with an arc discharge.

5. Method in accordance with claim 1 wherein said coating of said surfaces forming said cutting edge provides a compound coating from the group including titan nitride, titan carbide and titan carbon nitride.

6. A die for stripping the outer surface of an elongated metallic member, comprising:
    a cutting edge formed by the intersection of a truncated pyramid outer surface and an axial bore inner surface, said surfaces having a surface roughness, peak to valley, of less than 1 um., and being coated with a high hardness, high wear resistant metallic compound having a uniformly thin thickness between 1 and 10 um.

7. A stripping die in accordance with claim 6, wherein said metallic compound is from the group including titan nitride, titan carbide, and titan carbon nitride.

* * * * *